(12) United States Patent
Kobrin

(10) Patent No.: US 10,754,385 B2
(45) Date of Patent: Aug. 25, 2020

(54) DISPLAY WITH ACOUSTIC OR ULTRASONIC FEATURES

(71) Applicant: Innovasonic, Inc., Dublin, CA (US)

(72) Inventor: Boris Kobrin, Dublin, CA (US)

(73) Assignee: Innovasonic, Inc., Dublin, CA (US)

( * ) Notice: Subject to any disclaimer, the term of this patent is extended or adjusted under 35 U.S.C. 154(b) by 0 days.

(21) Appl. No.: 16/425,487

(22) Filed: May 29, 2019

(65) Prior Publication Data

US 2020/0012319 A1 Jan. 9, 2020

Related U.S. Application Data

(60) Provisional application No. 62/677,134, filed on May 28, 2018.

(51) Int. Cl.
| | | |
|---|---|---|
| *G06F 1/16* | (2006.01) | |
| *H01L 27/15* | (2006.01) | |
| *G06K 9/00* | (2006.01) | |
| *G06F 3/043* | (2006.01) | |
| *G09F 9/30* | (2006.01) | |

(52) U.S. Cl.
CPC .......... *G06F 1/1643* (2013.01); *G06F 1/1652* (2013.01); *G06F 3/043* (2013.01); *G06K 9/0002* (2013.01); *G09F 9/301* (2013.01); *H01L 27/156* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,550,564 A | * | 8/1996 | Cragun | G06F 3/039 345/173 |
| 6,946,170 B2 | * | 9/2005 | Gerber | G09F 13/24 40/406 |
| 7,801,576 B2 | * | 9/2010 | Fagrenius | H04M 1/21 455/575.1 |
| 8,890,853 B2 | * | 11/2014 | Schuele | G06F 3/0412 345/177 |
| 8,934,228 B2 | * | 1/2015 | Franklin | G06F 1/1652 361/679.26 |
| 10,478,858 B2 | * | 11/2019 | Lasiter | G06F 3/0412 |
| 2003/0167667 A1 | * | 9/2003 | Gerber | G09F 13/24 40/584 |
| 2007/0287515 A1 | * | 12/2007 | Fagrenius | H04M 1/21 455/575.4 |
| 2016/0058375 A1 | * | 3/2016 | Rothkopf | G06F 1/1643 600/301 |
| 2018/0326452 A1 | * | 11/2018 | Kobrin | C23C 18/165 |

* cited by examiner

*Primary Examiner* — Lisa Lea-Edmonds
(74) *Attorney, Agent, or Firm* — JDI Patent; Joshua D. Isenberg; Robert Pullman

(57) ABSTRACT

A micro-LED display having added functionalities like touch sensing, sound generation, self-cleaning, haptics and wireless charging by combining LED dies with micro-transducer dies or thin film structures on the same display substrate.

21 Claims, 2 Drawing Sheets

DISPLAY WITH ACOUSTIC OR ULTRASONIC FEATURES

1. FIELD OF THE DISCLOSURE

The present disclosure relates to displays, which could be fabricated in a variety of form factors, from very large TVs and video walls to a very small microdisplays used in AR/VR devices. The main idea is to add functionality to displays by incorporating acoustic or ultrasonic transducers.

2. BACKGROUND

This patent disclosure mainly relates to the so-called Micro-LED displays—a relatively new type of displays. They are based on inorganic emitters, like in a usual LED lighting product, thus micro-LED displays, like OLEDs, don't need external lighting (backlighting). The difference with regular LED devices are in size of dies and packaging. Micro-LEDs are scaled down LEDs to less than 300 nm (mini-LEDs) or less than 50 um (micro-LEDs) and integrated with display substrate. At the same time, the present invention can be used for larger size of LED-based emission displays used for video walls and digital signage. A pixel in micro-LED display is an individual LED die. Since the size of micro-LED is (for most products) much smaller than a pitch between dies on the substrate, there is a considerable free area of display, that could be used for hybridization: TFT drivers, IR and other types of sensors, other functionalities. We suggest to use this free space to integrate acoustic and ultrasonic micro-transducers to enable new functionalities of display.

3. BRIEF DESCRIPTION OF THE DRAWINGS

We suggest using free space between LED dies to add the following functionalities to display devices: speaker functionality, self-cleaning for cover glass or film, touch sensing, pressure sensing, wireless charging, energy harvesting, haptics. All these functionalities could be realized by integrating acoustic and ultrasonic transducers in individual die form or thin film pattern microstructure form on the same display substrate between individual LED dies of LED array. Acoustic and ultrasonic transducers could be fabricated using known piezoelectric materials, for example, PZT or Al or others. Alternatively, such an array could be fabricated using organic piezoelectric materials, like PVDF or similar.

Figure 1:
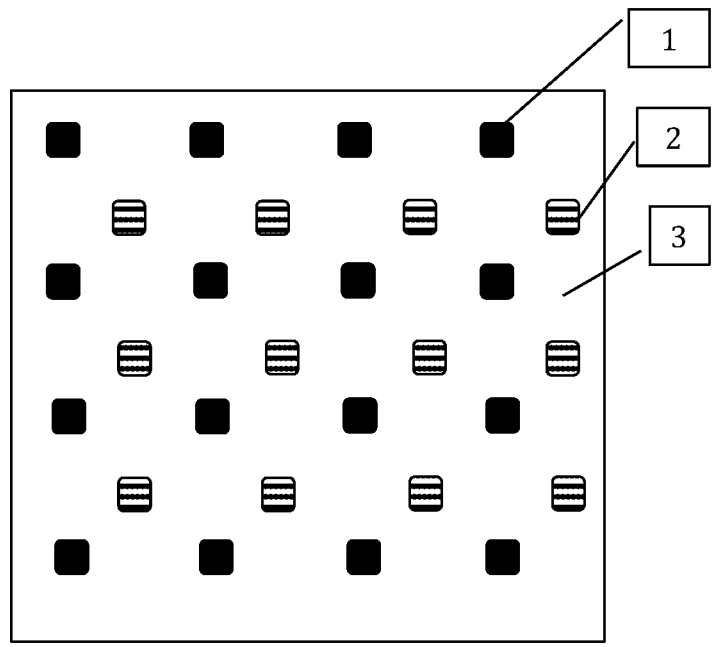
Figure 2:
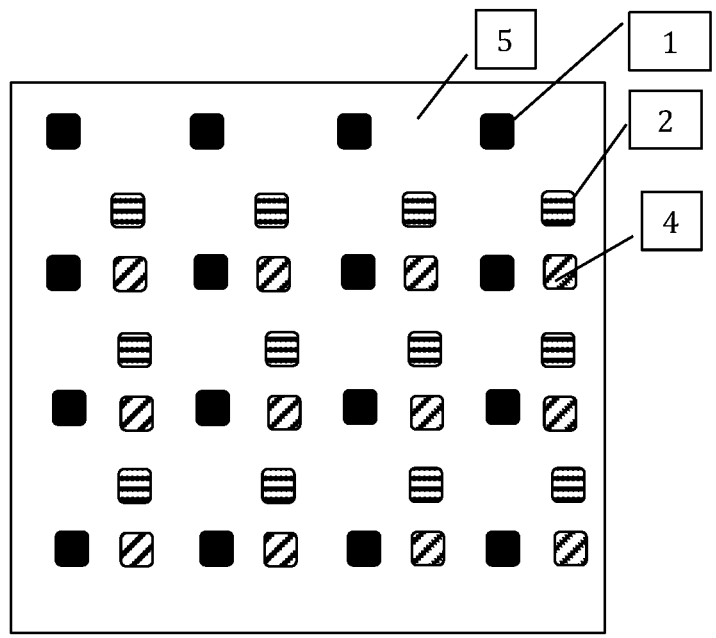
Figure 3:
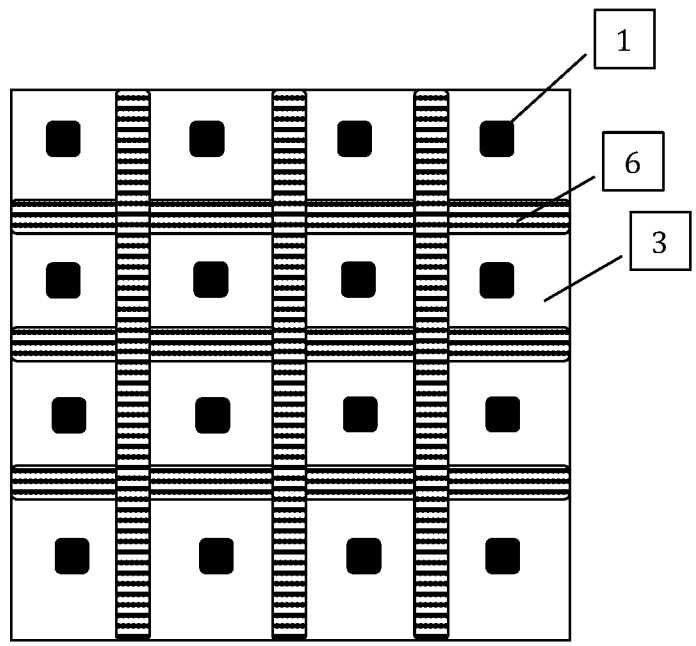
Figure 4:
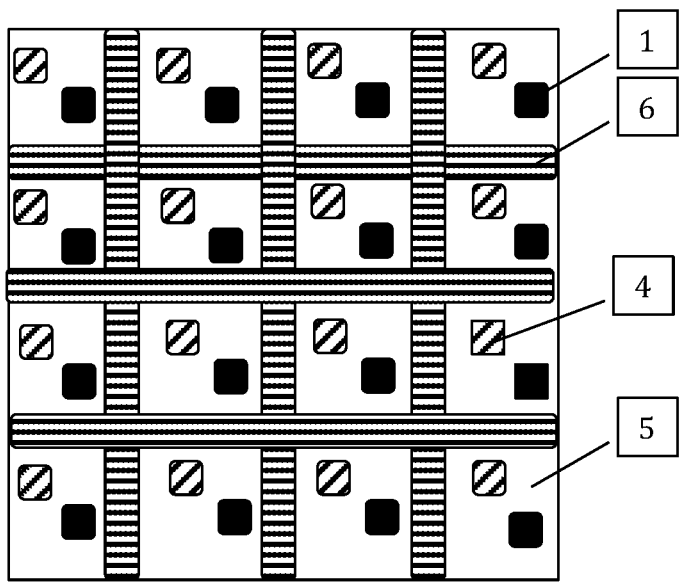

Various aspects of the present disclosure will become apparent upon reading the following detailed description and upon reference to the accompanying drawings in which:

FIG. 1 Schematic of display with micro-LEDs array and piezoelectric micro-transducer array assembled on the same display backplane FIG. 2 Schematic of display with micro-LEDs array, piezoelectric micro-transducer array, and driver chips assembled on the same display substrate FIG. 3 Schematic of display with micro-LEDs array assembled on the display backplane, where thin film piezoelectric micro-transducer structure is fabricated FIG. 4 Schematic of display with micro-LEDs array and driver chips are assembled on the display substrate, where thin film piezoelectric micro-transducer structure is fabricated

4. DETAILED DESCRIPTION

Embodiment-I

The device schematic is presented on FIG. 1. First, micro-LED dies (1) are transferred to display surface in pre-determined positions. Then, individual micro-transducers (2) are transferred and mounted to display substrate in the free spaces between micro-LED dies. Backplane (3) is prefabricated to have necessary wiring to provide power and control to transducers; control driver is located outside of display.

Embodiment-II

The device schematic is presented on FIG. 2. First, micro-LED dies (1) are transferred to display surface in pre-determined positions. Then, individual micro-transducers (2) and driver chips (4) are transferred and mounted to display substrate (5) in the free spaces between micro-LED dies.

Embodiment-III

The device schematic is presented on FIG. 3. First, individual micro-transducers (6) are fabricated with thin film piezoelectric stack on the backplane (3) between mounting positions of micro-LEDs. Then micro-LED dies (1) are transferred to display surface in pre-determined positions.

Embodiment-IV

The device schematic is presented on FIG. 4. First, individual micro-transducers (6) are fabricated with thin film piezoelectric stack on the display substrate (5). Then micro-LED dies (1) and driver dies (4) are transferred to display surface in pre-determined positions between micro-transducers.

Embodiment-IV

The acoustic micro-transducers are used for creating a speaker functionality integrated with display substrate. For this purpose, acoustic transducer should operate in the frequency range 20 Hz-20,000 Hz.

Embodiment-V

Ultrasonic transducers are used for self-cleaning display cover glass or cover film. Preferred cover glass thickness is less than 100 micron. Transducers are coupled to cover glass or film through impedance-matching material. Preferred frequency ranges from 20 KHz to 10 MHz.

Embodiment-VI

Ultrasonic micro-transducers are used for high resolution touch sensing. A pressure of finger's or stylus touch generates electric potential detected by circuitry for positioning of a touch on display screen. Entire display screen, multi-touch and force detection could be implemented using this embodiment.

Embodiment-VII

Ultrasonic micro-transducers are used for haptic display fabrication. Vibration of transducers change perception of friction between a finger and cover glass or cover film surface, which could be used for creating artificial buttons or other control features.

Embodiment-VIII

Micro-transducers are used for energy harvesting from sound or ultrasound waves, generated by human speaker, ambient sounds or ultrasonic waves emitted from an element in the vicinity of display. For example, an ultrasonic generator plugged to the wall could emit ultrasonic energy to the room where mobile display with integrated micro-transducer could absorb this energy and convert it to power. This effect could be used as wireless charging method.

Embodiment-IX

Display substrate could be rigid or flexible or foldable. Display can be stationary or mobile.

The invention claimed is:

1. A display comprising:
   a. a substrate;
   b. an array of LEDs;
   c. an array of piezoelectric transducers, assembled between LEDs;
   d. an electronic backplain to control LEDs and transducers.
2. The device of claim 1 wherein display is self-emissive and comprised of individual LEDs transferred to display substrate.
3. The device of claim 1 wherein LEDs are mini-LEDs with dimensions less than 3 mm and larger than 100 micron.
4. The device of claim 1 wherein LEDs are micro-LEDs with dimensions less than 100 micron.
5. The device of claim 1 wherein transducers have dimensions less than 1 mm.
6. The device of claim 1 wherein transducers have dimensions less than 100 micron.
7. The device of claim 1 wherein transducers are transferred to display substrate.
8. The device of claim 1 wherein transducers are thin film elements fabricated on display substrate.
9. The device of claim 1 wherein transducers are used for self-cleaning display cover glass or cover film.
10. The device of claim 1 wherein transducers are used for generating sound.
11. The device of claim 1 wherein transducers are used as sensors of pressure or touch of fingers or stylus.
12. The device of claim 1 wherein transducers are used for creating a vibration to give artificial feel of objects on display surface haptic performance.
13. The device of claim 1 wherein transducers are used for harvesting energy or wireless charging.
14. The device of claim 1 wherein display substrate is flexible or foldable.
15. The device of claim 1 wherein display substrate is transparent.
16. The device of claim 1 wherein transducer is made of inorganic material, like PZT or MN.
17. The device of claim 1 wherein transducer is made of organic material, like PVDF or similar.
18. A method for fabricating touch sensor for display, including:
    a. Transfer of individual LED dies on a substrate;
    b. Transfer individual piezoelectric transducers on a substrate;
    c. Connecting said LED and piezoelectric dies to a backplane;
    d. Analyzing signals from transducers to identify position of finger or stylus touch.
19. A method for fabricating self-cleaning display, including:
    a. Transfer of individual LED dies on a substrate;
    b. Transfer individual piezoelectric transducers on a substrate;
    c. Connecting said LED and piezoelectric dies to a backplane;
    d. Initiating surface acoustic waves on a cover glass or cover film for cleaning purposes.
20. A method for fabricating self-cleaning display, including:
    a. Transfer of individual LED dies on a substrate;
    b. Transfer individual piezoelectric transducers on a substrate;
    c. Connecting said LED and piezoelectric dies to a backplane;
    d. Initiating cavitation in a thin liquid layer on a cover glass or cover film for cleaning purposes.
21. A method for fabricating energy converter for display, including:
    a. Transfer of individual LED dies on a substrate;
    b. Transfer individual piezoelectric transducers on a substrate;
    c. Connecting said LED and piezoelectric dies to a backplane;
    d. Collecting electrical energy generated by transducers from application of pressure or touch on the surface, or absorbing ultrasonic energy emitted from an outside device.

* * * * *